US011991893B2

(12) United States Patent
Jung

(10) Patent No.: US 11,991,893 B2
(45) Date of Patent: May 21, 2024

(54) DISPLAY DEVICE HAVING AN AUXILIARY ELECTRODE INCLUDING A CONCAVE PORTION OR A CONVEX PORTION

(71) Applicant: LG Display Co., Ltd., Seoul (KR)

(72) Inventor: Sunggoo Jung, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 151 days.

(21) Appl. No.: 17/532,861

(22) Filed: Nov. 22, 2021

(65) Prior Publication Data

US 2022/0209173 A1    Jun. 30, 2022

(30) Foreign Application Priority Data

Dec. 31, 2020  (KR) .................... 10-2020-0189446

(51) Int. Cl.
  *H10K 50/82*   (2023.01)
  *H10K 50/16*   (2023.01)
  *H10K 50/814*  (2023.01)
  *H10K 50/824*  (2023.01)
  *H10K 71/00*   (2023.01)

(52) U.S. Cl.
  CPC .......... *H10K 50/824* (2023.02); *H10K 50/16* (2023.02); *H10K 50/814* (2023.02); *H10K 71/00* (2023.02)

(58) Field of Classification Search
  CPC .... H10K 50/824; H10K 50/814; H10K 71/00; H10K 50/16

USPC ........................................................ 257/40
See application file for complete search history.

(56) References Cited

U.S. PATENT DOCUMENTS

| | | | |
|---|---|---|---|
| 2011/0241563 A1* | 10/2011 | Kim ..................... | H10K 59/131 315/291 |
| 2013/0256638 A1* | 10/2013 | Uesugi ................. | H10K 50/824 438/34 |
| 2018/0254429 A1* | 9/2018 | Lee ...................... | H10K 59/122 |

FOREIGN PATENT DOCUMENTS

| CN | 20190122455 A | * 10/2019 | ............ H10K 71/00 |
|---|---|---|---|
| KR | 10-1768956 B1 | 8/2017 | |
| KR | 10-2113616 B1 | 6/2020 | |

* cited by examiner

*Primary Examiner* — Phuc T Dang
(74) *Attorney, Agent, or Firm* — Birch, Stewart, Kolasch & Birch, LLP

(57) ABSTRACT

A display device can include an overcoat layer disposed on a substrate; a light emitting device disposed on the overcoat layer, the light emitting device having an anode layer, an organic light emitting layer and a cathode layer; a contact hole extending through the overcoat layer; and an auxiliary electrode disposed in the contact hole and being connected to a first driving power, in which the cathode layer includes an organic layer and a cathode electrode layer, the cathode layer extends across the auxiliary electrode, the auxiliary electrode includes a contact region disposed in the contact hole and having a concave portion or a convex portion, and a portion of the cathode electrode layer directly contacts the contact region of auxiliary electrode.

11 Claims, 15 Drawing Sheets

DISPLAY DEVICE HAVING AN AUXILIARY ELECTRODE INCLUDING A CONCAVE PORTION OR A CONVEX PORTION

CROSS REFERENCE TO RELATED APPLICATION

The present application claims priority to Korean Patent Application No. 10-2020-0189446, filed Dec. 31, 2020 in the Republic of Korea, the entire contents of which are incorporated by reference into the present application.

BACKGROUND

Field of the Invention

The present disclosure relates to a display device and a manufacturing method thereof.

Description of the Related Art

An organic light emitting device (hereinafter, referred to as a light emitting device) constituting organic light emitting diodes (OLEDs) emits light by itself without a separate light source (e.g., no backlight needed), and thus, the OLED display device can be thinner and lighter. Also, the OLED display device shows high quality characteristics, such as low power consumption, a high luminance, and high response speed, etc.

In general, the light emitting device has a structure in which an anode electrode, a bank surrounding the edge region of the anode electrode, a light emitting layer formed on the anode electrode within the bank, and the cathode electrode covering the light emitting layer and the bank are stacked. Such a light emitting device emits light with a required luminance by controlling the amount of current flowing through the light emitting device by a driving transistor.

SUMMARY OF THE DISCLOSURE

One purpose of the present disclosure is to provide a display device which has its upper portion or top surface patterned concavely or convexly and includes an auxiliary electrode connected to a cathode electrode through a reflow process, and a manufacturing method thereof.

One embodiment is a display device including an auxiliary electrode which is disposed on the substrate and is connected to a low potential driving power; an organic layer which covers the auxiliary electrode; and a cathode electrode which is formed on the organic layer. The auxiliary electrode includes a concave portion or a convex portion which is formed on at least one of a top surface and a bottom surface thereof. The organic layer is formed on a region of the concave portion or the convex portion.

The auxiliary electrode can include the concave portion formed on the top surface, and the organic layer can be formed on a central region of the concave portion.

The cathode electrode can be in direct contact with the auxiliary electrode in an edge region of the concave portion where the organic layer is not formed.

The organic layer can be further formed on an edge region where the concave portion is not formed on the top surface.

In the auxiliary portion, a height of the top surface in a central region thereof can be less than a height of the top surface in an edge region thereof, the organic layer can be formed on the central region of the auxiliary electrode.

The auxiliary electrode can include the concave portion formed on the bottom surface, the organic layer can be formed in a central region of the auxiliary electrode, which overlaps the concave portion.

The auxiliary electrode can include a first convex portion formed on the top surface, and the organic layer can be formed on an edge region of the auxiliary electrode.

The edge region can include at least one of a region where the first convex portion is not formed and an edge region of the first convex portion.

The auxiliary electrode can further include a second convex portion which is formed on the bottom surface and is disposed to overlap the first convex portion.

The auxiliary electrode can include the convex portion formed on the bottom surface, the organic layer can be formed in a central region of the auxiliary electrode, which overlaps the convex portion.

The organic layer can be an electron transport layer.

Another embodiment is directed to a manufacturing method of a display device. The manufacturing method includes forming, on a substrate, an auxiliary electrode which is connected to a low potential driving power; forming an organic layer which covers the auxiliary electrode; forming a cathode electrode which is formed on the organic layer; and performing a reflow process by irradiating a laser to the substrate. The auxiliary electrode includes a concave portion or a convex portion which is formed on at least one of a top surface and a bottom surface thereof. During the reflow process, at least a portion of the organic layer is melted and flows into a region of the concave portion or the convex portion.

The forming the auxiliary electrode can include forming the concave portion on the top surface of the auxiliary electrode. During the reflow process, the organic layer can be melted on the concave portion and can flow into a central region of the concave portion.

The reflow process, the cathode electrode can be in direct contact with the auxiliary electrode in an edge region of the concave portion where the organic layer is not formed.

The forming the auxiliary electrode can include forming the concave portion on the bottom surface. During the reflow process, the organic layer can flow into a central region of the auxiliary electrode, which overlaps the concave portion.

The forming the auxiliary electrode can include forming a first convex portion on the top surface. During the reflow process, the organic layer can flow into an edge region of the auxiliary electrode.

The edge region can include at least one of a region where the first convex portion is not formed and an edge region of the first convex portion.

The forming the auxiliary electrode can further include forming a second convex portion which is formed on the bottom surface and is disposed to overlap the first convex portion.

The forming the auxiliary electrode can include forming the convex portion on the bottom surface. During the reflow process, the organic layer flows into a central region of the auxiliary electrode, which overlaps the convex portion.

DETAILED DESCRIPTION OF THE EMBODIMENTS

Figure 1:
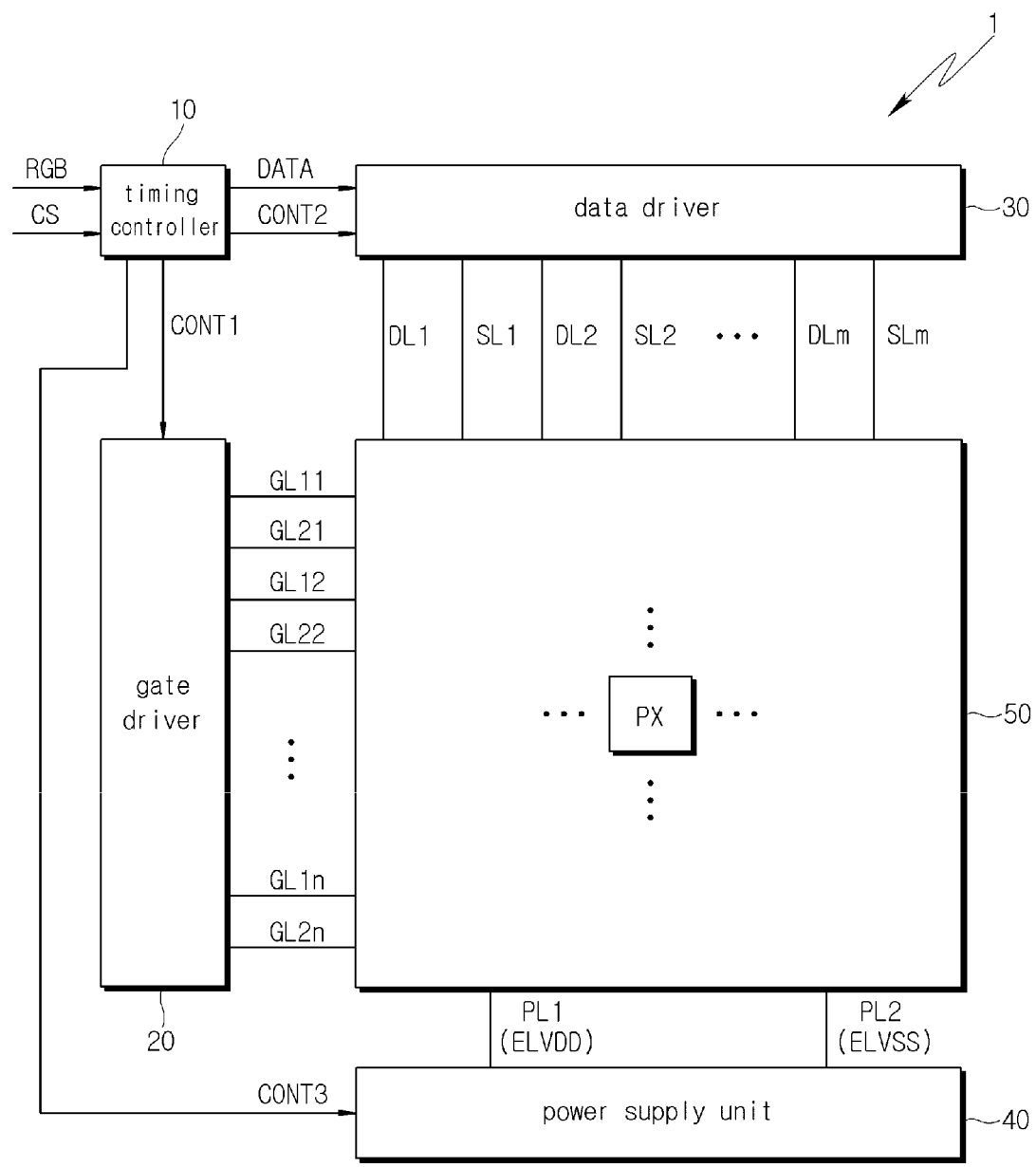
FIG. 1 is a block diagram showing a configuration of a display device according to an embodiment of the present disclosure.

Hereinafter, embodiments of the present disclosure will be described with reference to the accompanying drawings. In this specification, when it is mentioned that a component (or region, layer, portion) "is on," "is connected to," or "is combined with" another component, terms "is on," "connected to," or "combined with" mean that a component can be directly connected to/combined with another component or mean that a third component can be disposed between them.

The same reference numerals correspond to the same components. Also, in the drawings, the thicknesses, ratios, and dimensions of the components are exaggerated for effective description of the technical details. A term "and/or" includes all of one or more combinations that related configurations can define.

While terms such as the first and the second, etc., can be used to describe various components, the components are not limited by the terms mentioned above. The terms are used only for distinguishing between one component and other components. For example, the first component can be designated as the second component without departing from the scope of rights of various embodiments. Similarly, the second component can be designated as the first component. An expression of a singular form includes the expression of plural form thereof unless otherwise explicitly mentioned in the context.

Terms such as "below," "over," "lower," "above," "upper" and the like are used to describe the relationships between the components shown in the drawings. These terms have relative concepts and are described based on directions indicated in the drawings.

In the present specification, it should be understood that the term "include" or "comprise" and the like is intended to specify characteristics, numbers, steps, operations, components, parts or any combination thereof which are mentioned in the specification, and intended not to previously exclude the possibility of existence or addition of at least one another characteristics, numbers, steps, operations, components, parts or any combination thereof.

FIG. 1 is a block diagram showing a configuration of a display device according to an embodiment of the present disclosure.

Referring to FIG. 1, a display device 1 includes a timing controller 10, a gate driver 20, a data driver 30, a power supply unit 40, and a display panel 50.

The timing controller 10 can receive an image signal RGB and a control signal CS from the outside (e.g., from a host system). The image signal RGB can include a plurality of grayscale data. The control signal CS can include, for example, a horizontal synchronization signal, a vertical synchronization signal, and a main clock signal.

The timing controller 10 can process the image signal RGB and the control signal CS in conformity with operation conditions of the display panel 50, and then can generate and output an image data DATA, a gate driving control signal CONT1, a data driving control signal CONT2, a power supply control signal CONT3.

The gate driver 20 can generate gate signals based on the gate driving control signal CONT1 output from the timing controller 10. The gate driver 20 can provide the generated gate signals to pixels PX through a plurality of first gate lines GL11 to GL1n, where n is a positive integer.

The gate driver 20 can provide sensing signals to the pixels PX through a plurality of second gate lines GL21 to GL2n. The sensing signal can be provided to measure characteristics of a driving transistor and/or a light emitting device provided within the pixels PX.

The data driver 30 can generate data signals based on the image data DATA and the data driving control signal CONT2 output from the timing controller 10. The data driver 30 can provide the generated data signals to the pixels PX through a plurality of data lines DL1 to DLm, where m is a positive integer.

The data driver 30 can provide a reference voltage (or a sensing voltage, an initialization voltage) to the pixels PX through a plurality of sensing lines SL1 to SLm or can sense the state of the pixels PX based on electrical signals fed back from the pixels PX.

The power supply unit 40 can generate a driving voltage which is to be supplied to the display panel 50 based on the power supply control signal CONT3. The driving voltage can include, for example, a high potential driving voltage ELVDD and a low potential driving voltage ELVSS. The power supply unit 40 can supply the generated driving voltages ELVDD and ELVSS to the pixels PX through corresponding power lines PL1 and PL2.

A plurality of the pixels PX (or referred to as subpixels) are disposed on the display panel 50. The pixels PX can be arranged, for example, in a matrix form on the display panel 50. The pixels PX can emit light with a luminance which corresponds to the gate signal and the data signal provided through the first gate lines GL11 to GL1n and the data lines DL1 to DLm. In the embodiment, each pixel PX can represent any one of red, green, blue, and white colors. However, the embodiment is not limited thereto.

The timing controller 10, the gate driver 20, the data driver 30, and the power supply unit 40 can be each composed of a separate integrated circuit (IC), or can be configured as an IC in which at least some of them are integrated. For example, at least one of the data driver 30 and the power supply unit 40 can be configured as an integrated circuit integrated with the timing controller 10.

Also, although the gate driver 20 and the data driver 30 are shown in FIG. 1 as separate components from the display panel 50, at least one of the gate driver 20 and the data driver 30 can be implemented in an in-panel method where it is formed integrally with the display panel 50. For example, the gate driving part 20 can be formed integrally with the display panel 50 in a gate-in-panel (GIP) method.

Figure 2:
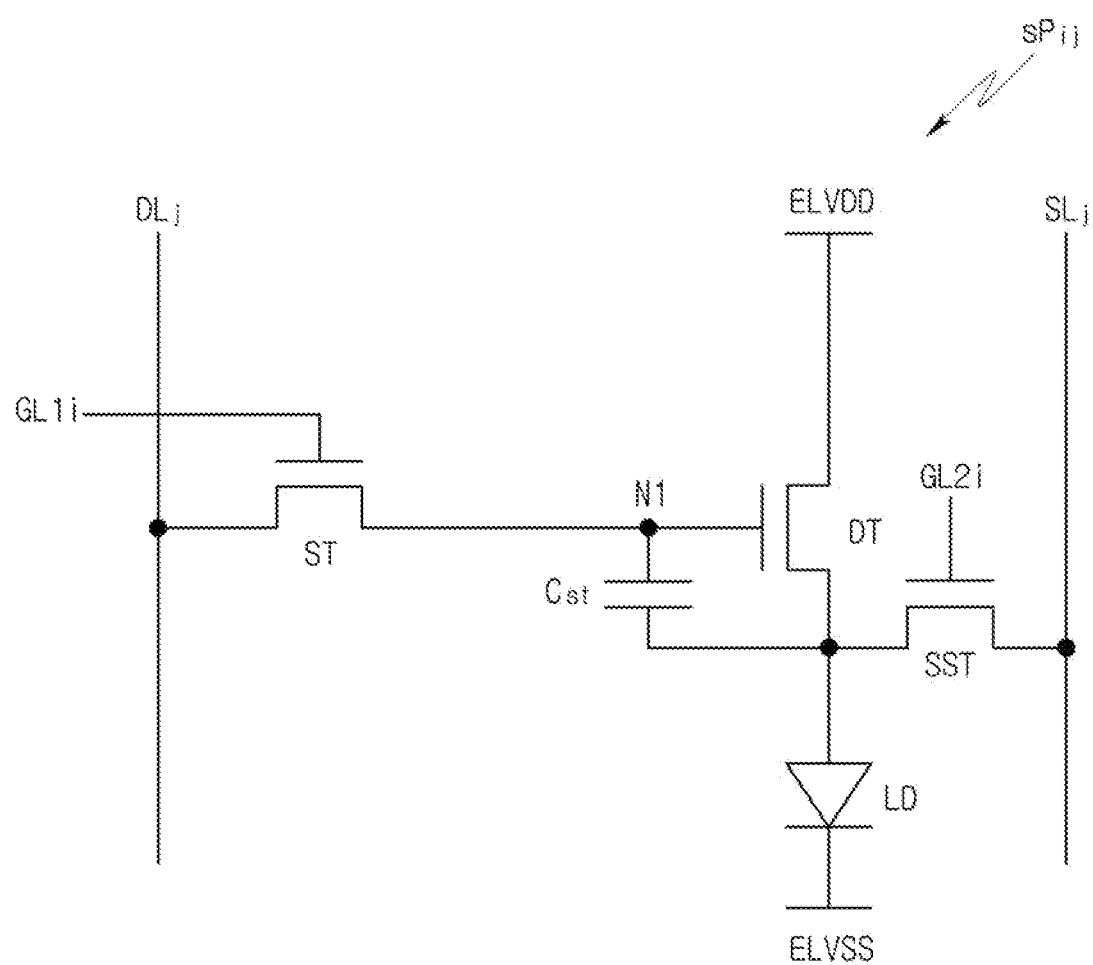
FIG. 2 is a circuit diagram showing an embodiment of a pixel shown in FIG. 1 according to an embodiment of the present disclosure.

FIG. 2 is a circuit diagram showing an embodiment of a pixel shown in FIG. 1. FIG. 2 shows the pixel PXij connected to the first i-th gate line GL1i and the j-th data line DLj as an example, wherein i and j are positive integers.

Referring to FIG. 2, the pixel PX includes a switching transistor ST, a driving transistor DT, a sensing transistor SST, a storage capacitor Cst, and a light emitting device LD (e.g., an OLED).

A first electrode of the switching transistor ST is electrically connected to the j-th data line DLj, and a second electrode of the switching transistor ST is connected to a first node N1. A gate electrode of the switching transistor ST is connected to the first gate line GL1i. The switching transistor ST is turned on when a gate signal of a gate-on level is applied to the first gate line GL1i, and transmits the data signal applied to the data line DLj to the first node N1.

A first electrode of the storage capacitor Cst can be connected to the first node N1, and a second electrode of the storage capacitor Cst can be configured to receive the high potential driving voltage ELVDD. The storage capacitor Cst can be charged with a voltage corresponding to a difference between a voltage applied to the first node N1 and the high potential driving voltage ELVDD.

A first electrode of the driving transistor DT is configured to receive the high potential driving voltage ELVDD, and a second electrode of the driving transistor DT is connected to a first electrode (e.g., anode electrode) of the light emitting device LD. A gate electrode of the driving transistor DT is electrically connected to the first node N1. The driving transistor DT can be turned on when a gate-on level voltage is applied through the first node N1, and can control the amount of driving current flowing through the light emitting device LD in response to the voltage applied to the gate electrode, that is, the voltage stored in the storage capacitor Cst.

A first electrode of the sensing transistor SST is connected to the sensing line SLj, and a second electrode of the sensing transistor SST is connected to the first electrode of the light emitting device LD. A gate electrode of the sensing transistor SST is connected to the second gate line GL2i. The sensing transistor SST is turned on when a sensing signal of a gate-on level is applied to the second gate line GL2i, and transmits a reference voltage applied to the sensing line SLj to the first electrode of the light emitting device LD.

The light emitting device LD outputs light corresponding to the driving current. The light emitting device LD can be an organic light emitting diode (OLED) or a micro inorganic light emitting diode having a size in a range from micro scale to nano scale. However, the present invention is not limited thereto. Hereinafter, embodiments in which the light emitting device LD is composed of the organic light emitting diode will be described.

In the embodiment, the structure of the pixels PX is not limited to what is shown in FIG. 2. According to the embodiment, the pixels PX can further include at least one element for compensating a threshold voltage of the driving transistor DT or initializing the voltage of the gate electrode of the driving transistor DT and/or the voltage of the anode electrode of the light emitting device LD.

FIG. 2 shows an example in which the switching transistor ST, the driving transistor DT, and the sensing transistor SST are NMOS transistors. However, the present invention is not limited thereto. For example, at least some or all of the transistors constituting each pixel PX can be composed of a PMOS transistor. In various embodiments, each of the switching transistor ST, the driving transistor DT, and the sensing transistor SST can be implemented with a low temperature poly silicon (LTPS) thin film transistor, an oxide thin film transistor, or a low temperature polycrystalline oxide (LTPO) thin film transistor.

Figure 3:
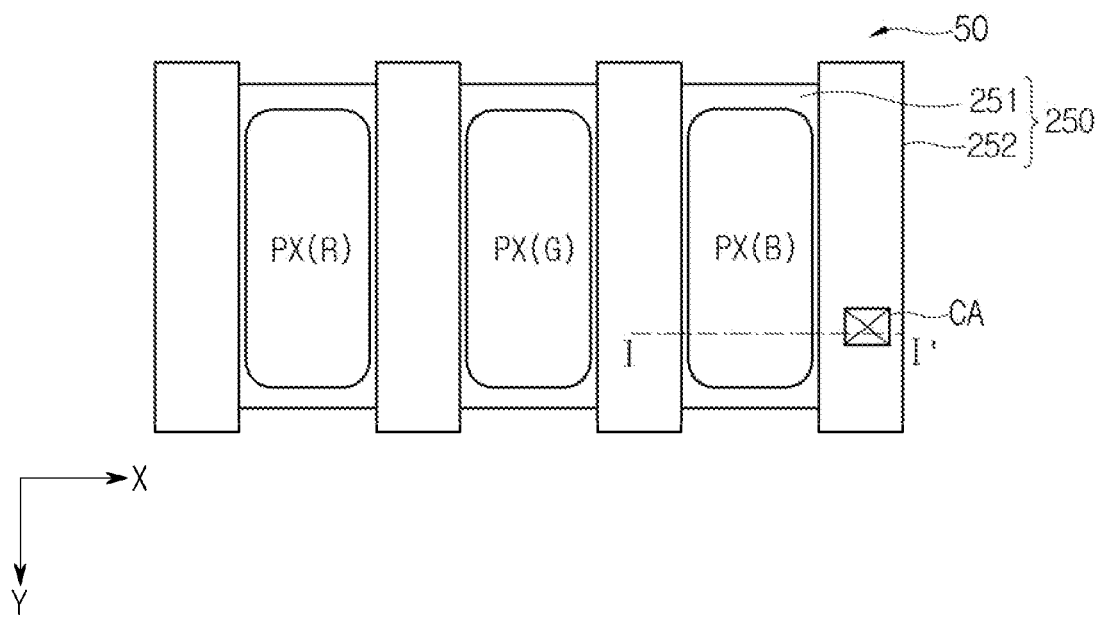
FIG. 3 is a plan view of a display panel according to an embodiment of the present disclosure.
Figure 4:
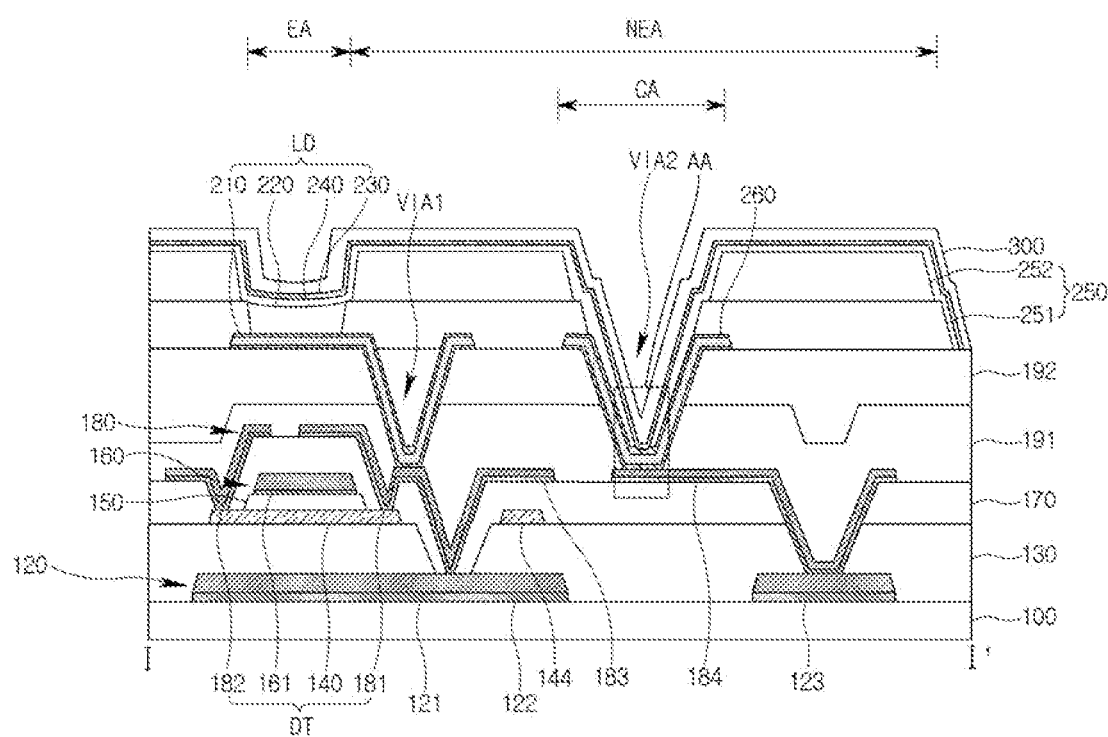
FIG. 4 is a schematic cross sectional view taken along line I-I' of FIG. 3 according to an embodiment of the present disclosure.

FIG. 3 is a plan view of the display panel according to an embodiment of the present disclosure. FIG. 4 is a schematic cross sectional view taken along line I-I' of FIG. 3.

Referring to FIG. 3, a plurality of the pixels PX are disposed on the display panel 50 according to the embodiment. The pixels PX can represent any one of red, green, and blue colors respectively. Here, three pixels PX representing red R, green G, and blue B colors can constitute one unit pixel.

A bank 250 is arranged around each of the pixels PX. In the embodiment, the bank 250 can have a structure in which a hydrophilic bank 251 and a hydrophobic bank 252 are stacked.

The hydrophilic bank 251 extends between pixel rows and between pixel columns in a row direction X and in a column direction Y. The hydrophilic bank 251 is formed in the form of a grid and separates the pixels PX. The hydrophilic bank 251 is made of a hydrophilic inorganic insulating material, such as silicon oxide SiO2 or nitride oxide SiNx, so that a solution spreads well in the formation of a light emitting layer 220 (e.g., a solution can be attracted to or pulled into and around the hydrophilic bank 251 areas), which will be described later.

The hydrophobic bank 252 can be formed in a partial region on the hydrophilic bank 251. The hydrophobic bank 252 can be disposed between the pixel rows and can partition the pixel rows. The hydrophobic bank 252 is formed such that at least one region, for example, an upper region, has hydrophobicity, thereby preventing color mixing between the pixel rows.

The pixels PX can be connected, through a contact hole formed in an auxiliary electrode contact part CA, to the second power line PL2 to which the low potential driving voltage ELVSS is applied. FIG. 3 shows an example in which one auxiliary electrode contact part CA is provided in a unit pixel. However, the present embodiment is not limited thereto, and each of the pixels PX can include the auxiliary electrode contact part CA.

Hereinafter, a more detailed structure of the pixels PX will be described.

Referring to FIG. 4, the display panel 50 according to the embodiment includes a substrate 100, a circuit element layer formed on the substrate 100 and provided with at least one circuit element, and a light emitting device layer including the light emitting device LD.

The substrate 100 is a base material of the display panel 50 and can be a light-transmitting substrate. The substrate 100 can be a rigid substrate including glass or tempered glass or a flexible substrate made of plastic. The substrate 100 can include a light emitting area EA and a non-light emitting area NEA. The non-light emitting area NEA includes the auxiliary electrode contact part CA in which contact is made between an auxiliary electrode 260 and a cathode electrode 230 of the light emitting device LD (e.g., a region where auxiliary electrode 260 directly touches cathode electrode 230).

The circuit element layer is formed on the substrate 100 and can include circuit elements (e.g., transistors, capacitors, etc.) and wirings which constitute the pixel PX.

A first conductive layer 120 can be disposed on the substrate 100. The first conductive layer 120 can include a light shielding layer 121, a lower electrode 122 of the storage capacitor Cst, and an auxiliary wiring 123. The auxiliary wiring 123 can be connected to the second power line PL2 to which the low potential driving voltage ELVSS is applied. The light shielding layer 121 is disposed to overlap with an active layer 140, in particular, a channel on a plane, thereby protecting an oxide semiconductor device from external light. The lower electrode 122 of the storage capacitor Cst can be integrally formed with the light shielding layer 121 as one pattern. However, the present embodiment is not limited thereto.

A buffer layer 130 is disposed on the substrate 100 to cover the first conductive layer 120. The buffer layer 130 can prevent diffusion of ions or impurities from the substrate 100 and block moisture penetration.

The active layer 140 can be formed on the buffer layer 130. The active layer 140 can be formed of a silicon-based semiconductor material or an oxide-based semiconductor material. The active layer 140 can include a source region and a drain region which include p-type or n-type impurities, and a channel formed between the source region and the drain region. One region of the active layer 140 can form an intermediate electrode 144 of the storage capacitor Cst. The intermediate electrode 144 can be disposed such that at least one region thereof overlaps with the lower electrode 122.

A gate insulating layer 150 can be disposed to correspond to a region where a below-described gate electrode 161 is to be formed. For example, the gate insulating layer 150 can be formed on the channel of the active layer 140.

A second conductive layer 160 can be disposed on the gate insulating layer 150. The second conductive layer 160 can include the gate electrode 161. The gate electrode 161 can be disposed at a position corresponding to the channel of the active layer 140.

An interlayer insulating layer 170 can be formed on the second conductive layer 160. A third conductive layer 180 can be formed on the interlayer insulating layer 170. The third conductive layer 180 can include a source electrode 181 and a drain electrode 182. The source electrode 181 and the drain electrode 182 can be connected to the source region and the drain region of the active layer 140 respectively through a contact hole which passes through the interlayer insulating layer 170. The source electrode 181 and the drain electrode 182 can be formed as a single layer or multiple layers.

The source electrode 181, the drain electrode 182, the gate electrode 161, and the active layer 140 corresponding to them can constitute a transistor. In FIG. 4, the driving transistor DT in which the source electrode 181 is connected to the anode electrode 210 of the light emitting device LD is shown as an example.

The third conductive layer 180 can further include an upper electrode 183 of the storage capacitor Cst. In the embodiment, the upper electrode 183 can be integrally formed with the drain electrode 182 of the driving transistor DT. However, the present embodiment is not limited thereto. An electric field can be formed between the intermediate electrode 144 formed in the active layer 140 and the upper electrode 183 formed in the third conductive layer 180 and can function as the storage capacitor Cst.

The third conductive layer 180 can further include a bridge electrode 184. The bridge electrode 184 is connected to the auxiliary wiring 123 through a contact hole which passes through the interlayer insulating layer 170 and the buffer layer 130.

The circuit element layer can be covered by a passivation layer 191 and an overcoat layer 192. The passivation layer 191 can be an insulating layer to protect the devices thereunder, and the overcoat layer 192 can be a planarization layer for reducing a step difference in the structure thereunder.

The light emitting device layer is formed on the overcoat layer 192 and includes the light emitting devices LDs. The light emitting device LD includes the anode electrode 210, the light emitting layer 220, and the cathode electrode 230.

The anode electrode 210 is formed on the overcoat layer 192. The anode electrode 210 is connected to the driving transistor DT through a first via hole VIA1, which passes through the overcoat layer 192 and the passivation layer 191. The anode electrode 210 can be formed of a transparent conductive material such as indium tin oxide (ITO), indium zinc oxide (IZO), zinc oxide (ZnO), etc. When the anode electrode 210 is a reflective electrode, the anode electrode 210 can be formed as a triple layer composed of a transparent conductive layer/a reflective layer (a metal oxide layer)/a transparent conductive layer. For example, the anode electrode 210 can be formed as a triple layer including ITO/Ag/ITO.

The auxiliary electrode 260 for electrically connecting the cathode electrode 230 and the second power line PL2 is further formed on the overcoat layer 192. The auxiliary electrode 260 can be disposed in the auxiliary electrode contact part CA of the non-light emitting area NEA, can be made of the same material as the anode electrode 210, and can be formed in the same process. The auxiliary electrode 260 can be connected to the bridge electrode 184 through a second via hole VIA2, which passes through the overcoat layer 192 and the passivation layer 191.

The bank 250 can be formed on the overcoat layer 192. The bank 250 can be formed to expose some regions of the anode electrode 210, for example, a central region and to cover the remaining region, for example, edges of the anode electrode 210. The exposed region of the anode electrode 210, which is not covered by the bank 250, can be defined as the light emitting area EA of the pixel PX. In the non-light emitting area NEA, the bank 250 can be formed to expose a region of the auxiliary electrode 260.

The light emitting layer 220 is formed on the exposed region of the anode electrode 210 surrounded by the bank 250. In the embodiment, the light emitting layer 220 can be formed through a solution process. For example, a solution for forming the light emitting layer 220 within the light emitting area EA can be applied. The solution can be manufactured by mixing organic materials constituting the light emitting layer 220 with a solvent. The solution can be jetted to the light emitting area through an inkjet apparatus having a nozzle mounted on an inkjet head. The applied ink is dried to form the light emitting layer 220. In the light emitting layer 220 to be formed through the solution process, the surface of the central region can be lower than the surface of the edge region. However, the embodiment is not limited thereto.

In the embodiment, a hole transport layer (HTL), a hole injection layer (HIL), or the like can be disposed between the light emitting layer 220 and the anode electrode 210.

The cathode electrode 230 is formed on the light emitting layer 220. The cathode electrode 230 can be formed of a transparent conductive material (TCO) or a semi-transmissive conductive material which is capable of transmitting light.

An electron transport layer (ETL) 240 can be disposed between the cathode electrode 230 and the light emitting layer 220. The electron transport layer 240 serves to smoothly transfer electrons injected from the cathode electrode 230 to the light emitting layer 220.

The electron transport layer 240 and the cathode electrode 230 can be widely formed on the display panel 50. In the light emitting area EA, the electron transport layer 240 and the cathode electrode 230 can be sequentially stacked on the anode electrode 210 and the light emitting layer 220. In the auxiliary electrode contact part CA, the electron transport layer 240 and the cathode electrode 230 can be sequentially stacked on the auxiliary electrode 260. The cathode electrode 230 can be electrically connected to the second power line PL2 via the auxiliary electrode 260, the bridge electrode 184, and the auxiliary wiring 123.

An encapsulation layer 300 can be formed on the cathode electrode 230. The encapsulation layer 300 serves to prevent external moisture from penetrating into the light emitting layer 220. The encapsulation layer 300 can be formed of an inorganic insulating material or can have a structure in which an inorganic insulating material and an organic insulating material are alternately stacked, and is not limited thereto.

In addition, when the electron transport layer 240 that is an organic layer is interposed between the cathode electrode 230 and the auxiliary electrode 260, an electrical resistance between the cathode electrode 230 and the auxiliary electrode 260 can increase. In order to prevent this, a reflow process of irradiating a laser to the auxiliary electrode contact part CA can be applied. In the reflow process, the electron transport layer 240 interposed between the cathode electrode 230 and the auxiliary electrode 260 is removed or at least thinned in the auxiliary electrode contact part CA, so that the electrical resistance between the cathode electrode 230 and the auxiliary electrode 260 is reduced (e.g., to improve the electrical connection between the cathode electrode and the auxiliary electrode at the CA region). This reflow process can be performed by irradiating a laser to the auxiliary electrode contact part CA. When a laser is irradiated, a portion of the electron transport layer 240 can be melted and removed or thinned in at least one region on the auxiliary electrode 260. Then, the cathode electrode 230 and the auxiliary electrode 260 can be in direct contact with each other or the electrical resistance between the cathode electrode 230 and the auxiliary electrode 260 can be reduced.

The intensity of the laser irradiated to the auxiliary electrode contact part CA can vary depending on the region. This can cause excessive reflow of the organic layer, that is, the electron transport layer 240 in a specific region, or can cause a problem that the electron transport layer 240 is not melted in another specific region. Then, the auxiliary electrode contact part CA cannot be manufactured in a required shape, which can cause a defect of the display panel 50.

In the following embodiments, a defect problem of the auxiliary electrode contact part CA is solved by laser intensity imbalance due to the patterning of the auxiliary electrode 260 in a special shape. Hereinafter, various patterns of the auxiliary electrode 260 will be described in more detail with reference to the drawings.

Figure 5:
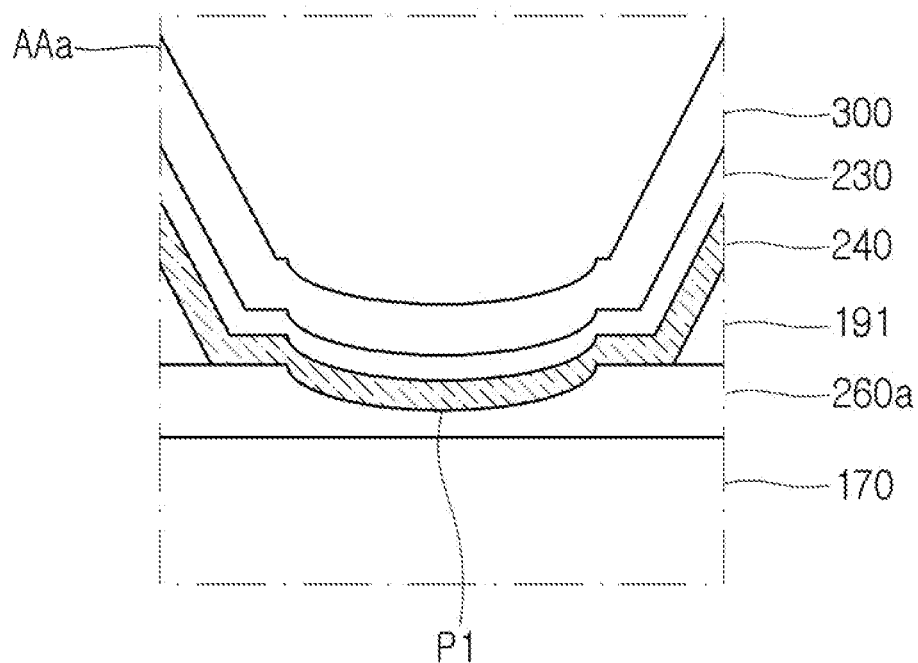
FIG. 5 is an enlarged cross sectional view of an area AA of FIG. 4 according to an embodiment of the present disclosure
Figure 6:
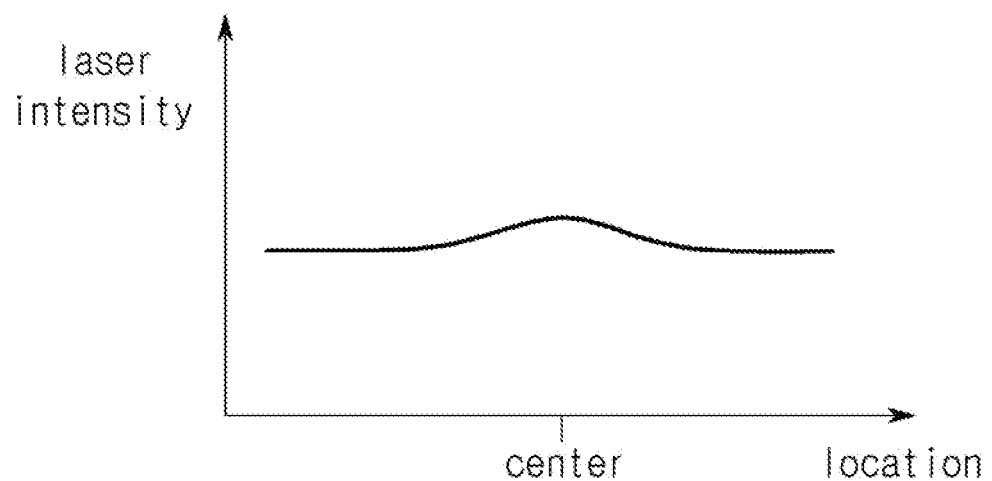
FIG. 6 is a view showing an intensity distribution of laser irradiated to the display panel according to an embodiment of the present disclosure.
Figure 7:
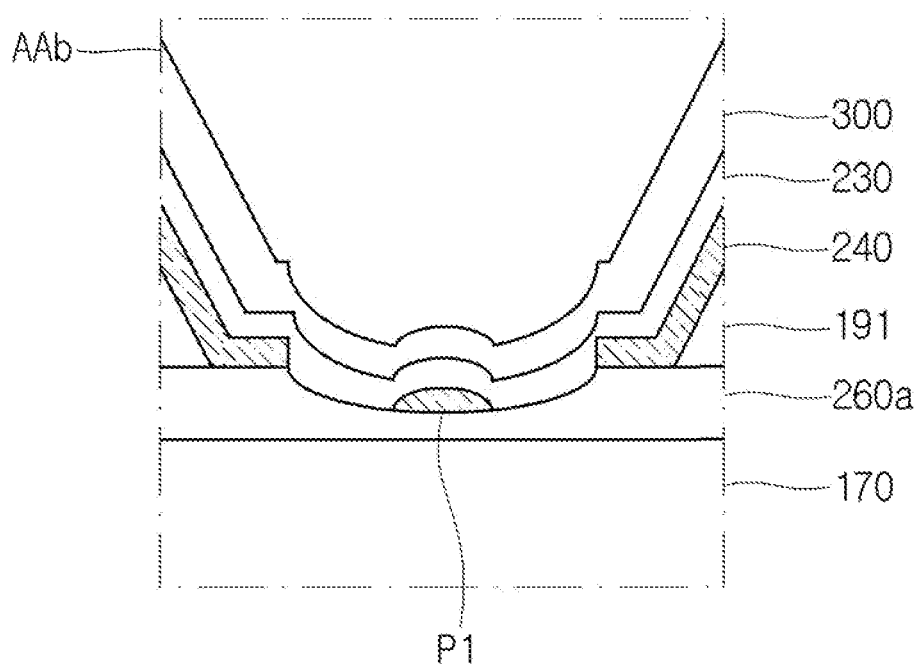
FIG. 7 is a view showing a state after a reflow process of an auxiliary electrode contact part shown in FIG. 5 according to an embodiment of the present disclosure.

FIG. 5 is an enlarged cross sectional view of an area AA (AAa) of FIG. 4 according to a first embodiment. FIG. 6 is a view showing an intensity distribution of laser irradiated to the display panel. FIG. 7 is a view showing a state after a reflow process of an auxiliary electrode contact part shown in FIG. 5.

Referring to FIG. 5, an auxiliary electrode 260a according to the first embodiment includes a concave portion P1 formed on the top surface (e.g., the upper surface of auxiliary electrode 260a can be formed from the same material as the anode electrode 210). The concave portion P1 can be formed on the entire or a portion of exposed top surface of the auxiliary electrode 260a.

The concave portion P1 can be formed as a curved surface as shown, and the present embodiment is not limited thereto. That is to say, in various embodiments, as long as a thickness of a central region of the concave portion P1 is less than a thickness of an edge region of the concave portion P1 and a height of the top surface in the central region is less than that of the edge region, the concave portion P1 can have various shapes without limitation.

In the reflow process, the laser applied to the display panel 50 generally has an intensity distribution shown in FIG. 6. That is, the laser can have the highest intensity in the center region and the lowest intensity in the edge region.

When the laser is irradiated to the auxiliary electrode contact part CA for the reflow process, the less the thickness of the auxiliary electrode 260a is, the more easily the energy of the laser can reach the electron transport layer. Accordingly, on the region of the auxiliary electrode 260a, which has a smaller thickness, more electron transport layers 240 can be melted.

In the embodiment of FIG. 5, when the reflow process is performed by irradiating the laser, the electron transport layers 240 can be melted by a greater degree within the concave portion P1, and may not be melted or less melted in the region around the concave portion P1. Here, the electron transport layer 240 melted within the concave portion P1 can flow into the central region of the concave portion P1 due to the inclination of the inner wall of the concave portion P1 (e.g., a melted portion of electron transport layer 240 can pool together at a center of the concave portion P1, allowing for between contact between the cathode electrode 230 and the auxiliary electrode 260a).

After the reflow process, as shown in the area AA (AAb) of FIG. 7, the electron transport layer 240 is formed on the central region of the concave portion P1 on the auxiliary electrode 260a. According to the embodiment, the electron transport layer 240 can be further formed in the region around the concave portion P1 where the concave portion P1 is not formed.

In the above embodiment, the edge region of the concave portion P1 of the auxiliary electrode 260a is not covered by the electron transport layer 240 and is exposed upward. The cathode electrode 230 can be formed on the exposed region of the auxiliary electrode 260a. Then, the cathode electrode 230 is in direct contact with the auxiliary electrode 260a in the exposed region of the auxiliary electrode 260a (e.g., improving the contact between the auxiliary electrode 260a and the cathode electrode 230).

In the embodiment, the reflow of the electron transport layer 240 can be controlled, such that the electron transport layer 240 is melted in a specific region due to the concave portion P1 of the auxiliary electrode 260a. Accordingly, defects of the auxiliary electrode contact part CA due to excessive reflow of the electron transport layer 240 can be minimized.

Figure 8:
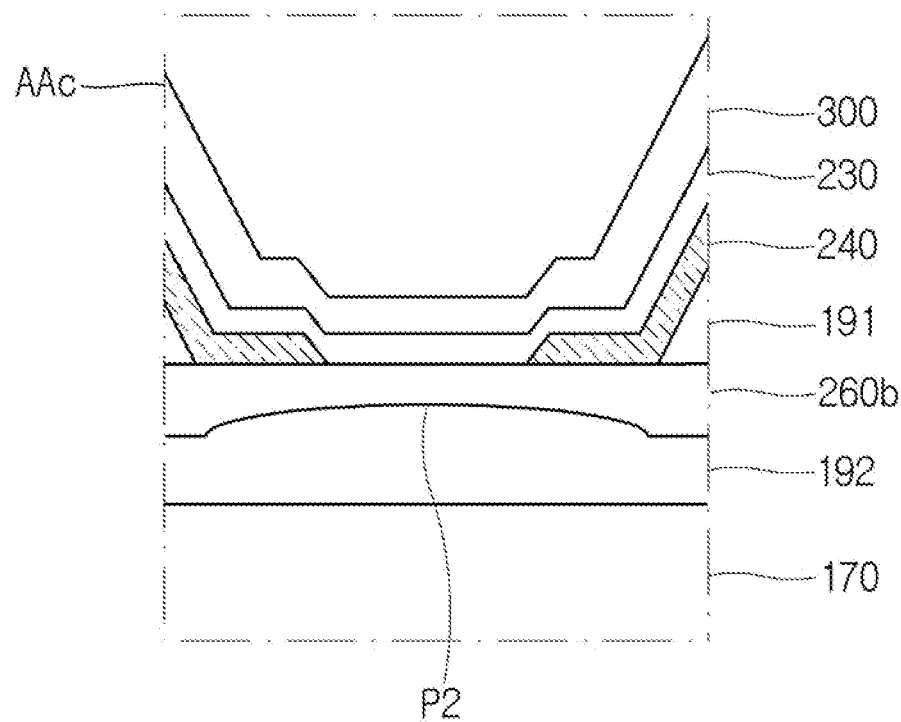
FIG. 8 is an enlarged cross sectional view of the area AA of FIG. 4 according to another embodiment of the present disclosure

FIG. 8 is an enlarged cross sectional view of the area AA (AAc) of FIG. 4 according to a second embodiment.

Referring to FIG. 8, an auxiliary electrode 260b according to the second embodiment includes a concave portion P2 formed on the bottom surface. The concave portion P2 can be formed as a curved surface as shown, and the present embodiment is not limited thereto. That is to say, in various embodiments, as long as a thickness of a central region of the concave portion P2 is less than a thickness of an edge region of the concave portion P2 and a height of the bottom surface in the central region is greater than that of the edge region, the concave portion P2 can have various shapes without limitation.

When a laser is irradiated to the auxiliary electrode contact part CA for the reflow process, the electron transport layer 240 can be melted even further in the central region of the auxiliary electrode 260b, which has a smaller thickness, and may not be melted or less melted in the edge region of the auxiliary electrode 260b, which has a larger thickness. Here, the melted electron transport layer 240 can flow to the edge region by peripheral tension. After the reflow process, as shown in FIG. 8, the electron transport layer 240 can be formed on the edge region of the auxiliary electrode 260b.

In the above embodiment, the central region of the auxiliary electrode 260b, which overlaps with the concave portion P2, is not covered by the electron transport layer 240 and is exposed upward. The cathode electrode 230 can be formed on the exposed region of the auxiliary electrode 260b. Then, the cathode electrode 230 is in direct contact with the auxiliary electrode 260b in the exposed region of the auxiliary electrode 260b.

Figure 9:
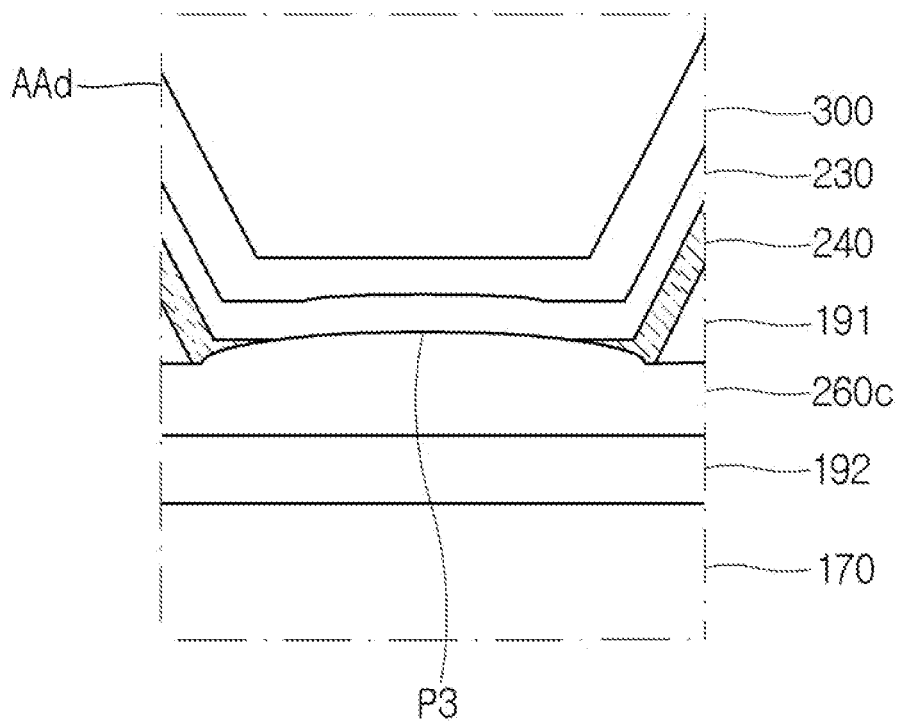
FIG. 9 is an enlarged cross sectional view of the area AA of FIG. 4 according to another embodiment of the present disclosure.

FIG. 9 is an enlarged cross sectional view of the area AA (AAd) of FIG. 4 according to a third embodiment.

Referring to FIG. 9, an auxiliary electrode 260c according to the third embodiment can include a convex portion P3 formed on the top surface (e.g., the auxiliary electrode 260c can have an embossed pattern, a mound or a bump in the CA region). The convex portion P3 can be formed on the entire or a portion of exposed top surface of the auxiliary electrode 260c.

The convex portion P3 can be formed as a curved surface as shown, and the present embodiment is not limited thereto. That is, in various embodiments, as long as a thickness of a central region of the convex portion P3 is larger than a thickness of an edge region of the convex portion P3 and a height of the top surface in the central region is greater than that of the edge region, the convex portion P3 can have various shapes without limitation.

When a laser is irradiated to the auxiliary electrode contact part CA for the reflow process, the electron transport layer 240 can be melted. The melted electron transport layer 240 can flow to an edge region having a low height of the top surface. Here, the edge region can include a region around the convex portion P3 where the convex portion P3 is not formed and/or the edge region of the convex portion P3. After the reflow process, as shown in FIG. 9, the electron transport layer 240 can be formed on the edge region of the auxiliary electrode 260c.

In the above embodiment, the central region of the convex portion P3 is not covered by the electron transport layer 240 and is exposed upward. The cathode electrode 230 can be formed on the exposed region of the auxiliary electrode 260c. Then, the cathode electrode 230 is in direct contact with the auxiliary electrode 260c in the exposed region of the auxiliary electrode 260c.

Figure 10:
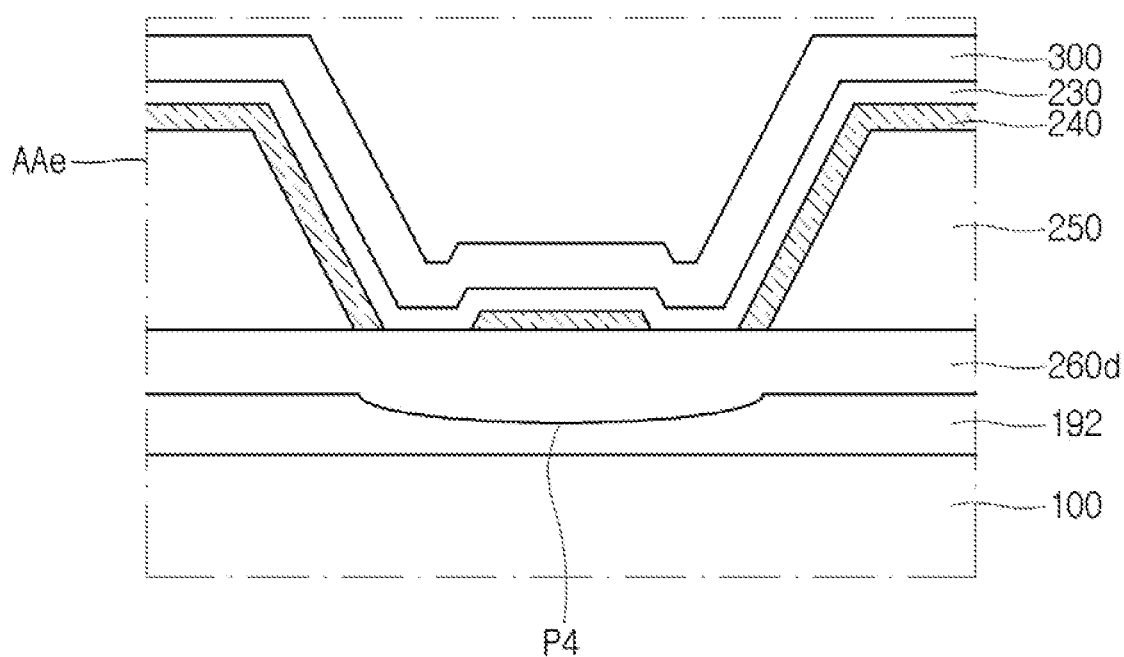
FIG. 10 is an enlarged cross sectional view of the area AA of FIG. 4 according to another embodiment of the present disclosure

FIG. 10 is an enlarged cross sectional view of the area AA (AAe) of FIG. 4 according to a fourth embodiment.

Referring to FIG. 10, an auxiliary electrode 260d according to the fourth embodiment can include a convex portion P4 formed on the bottom surface. The convex portion P4 can be formed as a curved surface as shown, and the present embodiment is not limited thereto. That is, in various embodiments, as long as a thickness of a central region of the convex portion P4 is larger than a thickness of an edge region of the convex portion P4 and a height of the bottom surface in the central region is greater than that of the edge region, the convex portion P4 can have various shapes without limitation.

When a laser is irradiated to the auxiliary electrode contact part CA for the reflow process, the electron transport layer 240 can be further melted in the edge region of the auxiliary electrode 260d, which has a smaller thickness, and may not be melted or less melted in the central region of the auxiliary electrode 260d, which has a larger thickness. Here, the melted electron transport layer 240 can flow into the central region by peripheral tension. After the reflow process, as shown in FIG. 10, the electron transport layer 240 can be formed on the central region of the auxiliary electrode 260d.

In the above embodiment, the edge region of the auxiliary electrode 260d, which does not overlap the convex portion P4, is not covered by the electron transport layer 240 and is exposed upward. The cathode electrode 230 can be formed on the exposed region of the auxiliary electrode 260d. Then, the cathode electrode 230 is in direct contact with the auxiliary electrode 260d in the exposed region of the auxiliary electrode 260d.

Figure 11:
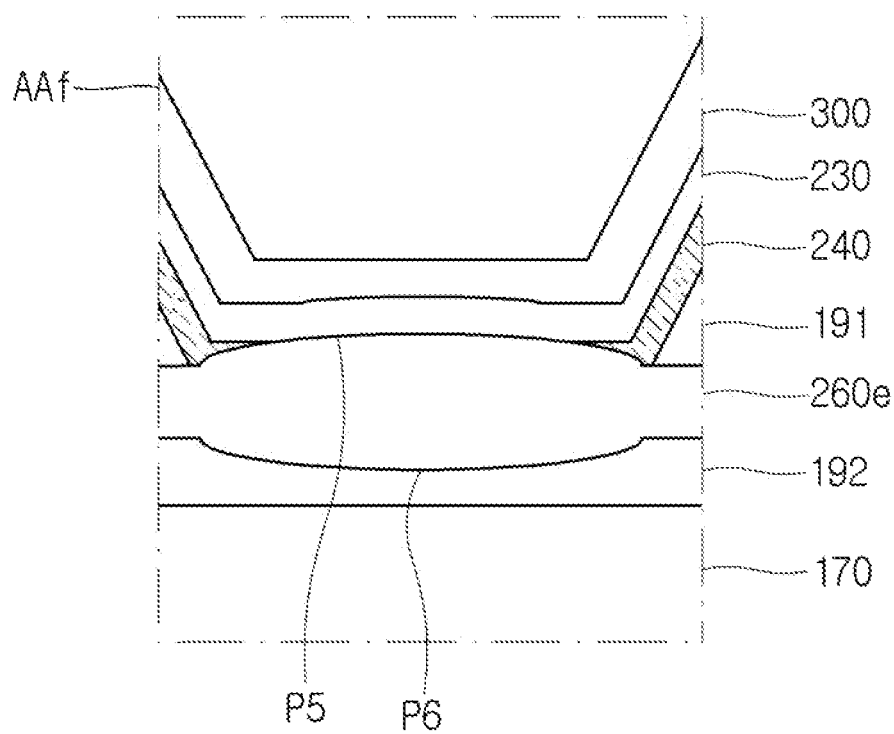
FIG. 11 is an enlarged cross sectional view of the area AA of FIG. 4 according to another embodiment of the present disclosure.

FIG. 11 is an enlarged cross sectional view of the area AA (AAf) of FIG. 4 according to a fifth embodiment.

Referring to FIG. 11, an auxiliary electrode 260e according to the fifth embodiment includes a first convex portion P5 which is formed on the top surface and a second convex portion P6 which is formed on the bottom surface and is disposed to overlap the first convex portion P5. The first convex portion P5 and the second convex portion P6 can be formed as a curved surface as shown, and the present embodiment is not limited thereto.

When a laser is irradiated to the auxiliary electrode contact part CA for the reflow process, the electron transport layer 240 can be melted. The melted electron transport layer 240 can flow to an edge region having a low height of the top surface. Here, the edge region can include a region around the first convex portion P5 where the first convex portion P5 is not formed and/or the edge region of the first convex portion P5. After the reflow process, as shown in FIG. 11, the electron transport layer 240 can be formed on the edge region of the auxiliary electrode 260e.

In the above embodiment, the central region of the first convex portion P5 is not covered by the electron transport layer 240 and is exposed upward. The cathode electrode 230 can be formed on the exposed region of the auxiliary electrode 260e. Then, the cathode electrode 230 is in direct contact with the auxiliary electrode 260e in the exposed region of the auxiliary electrode 260e.

FIGS. 12 to 16 shows a manufacturing method of the display device according to the embodiment.

Figure 12:
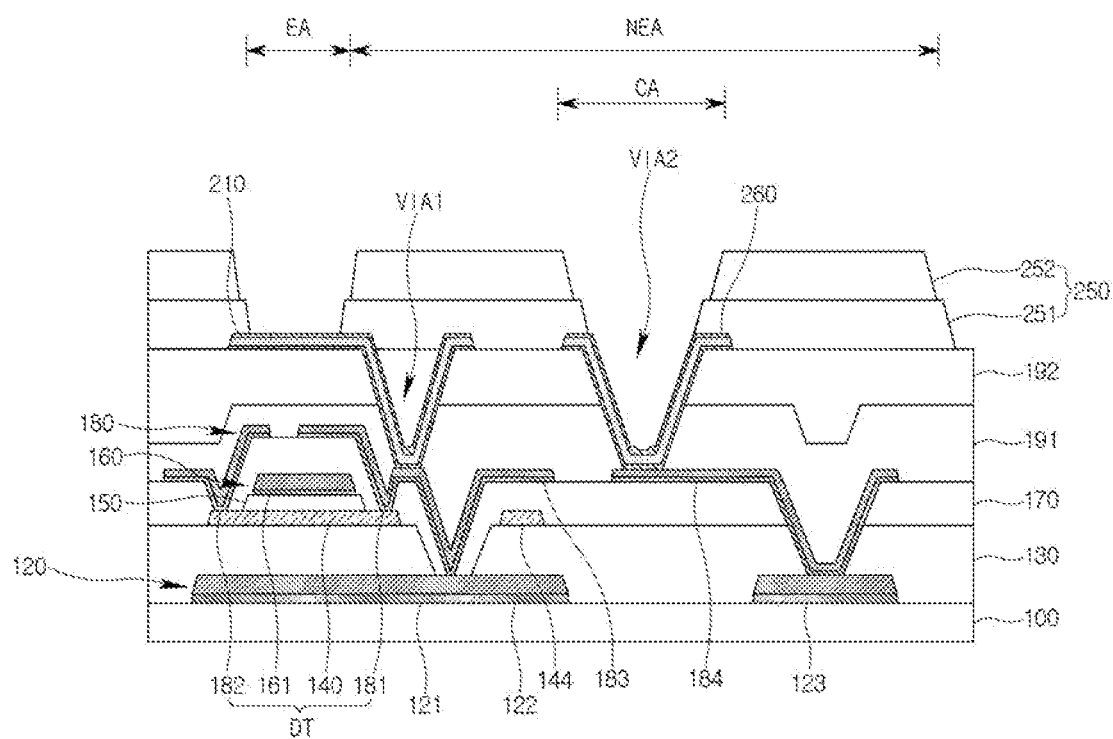
FIGS. 12 to 16 show a manufacturing method of the display device according to an embodiment of the present disclosure

Referring to FIG. 12, first, the circuit element layer can be formed on the substrate 100. Specifically, the first to third conductive layers 120 to 180, the passivation layer 191, and the overcoat layer 192 are formed on the substrate 100.

The anode electrode 210 is formed on the overcoat layer 192 in the light emitting area EA. Also, the auxiliary electrode 260 is formed on the overcoat layer 192 in the auxiliary electrode contact part CA of the non-light emitting area NEA. The auxiliary electrode 260 is connected to the bridge electrode 184.

The auxiliary electrode 260 can be formed to have a specific pattern, as described with reference to FIGS. 5 to 11.

In the embodiment, the auxiliary electrode 260 can be formed to have a concave portion or a convex portion formed on the top surface and/or the bottom surface.

The bank 250 is formed on the overcoat layer 192. The bank 250 can be formed to expose the central region of the anode electrode 210 and to cover the edge region. Also, the bank 250 can be formed to expose the central region of the auxiliary electrode 260 and to cover the edge region.

At least a portion of the surface of the bank 250 can be formed to have hydrophobicity. For example, the bank 250 can be formed by applying a solution in which a hydrophobic material, such as fluorine (F) is mixed with an organic insulating material and then by a photolithography process. The hydrophobic material, such as fluorine, can move to the top of the bank 250 by light irradiated during the photolithography process, and accordingly, the top surface of the bank 250 can have a hydrophobic property and the remaining portion can have a hydrophilic property. When the light emitting layer 220 is formed through a solution process, the hydrophobic bank 250 can serve as a dam to prevent ink from being mixed between the light emitting areas EA.

Figure 13:
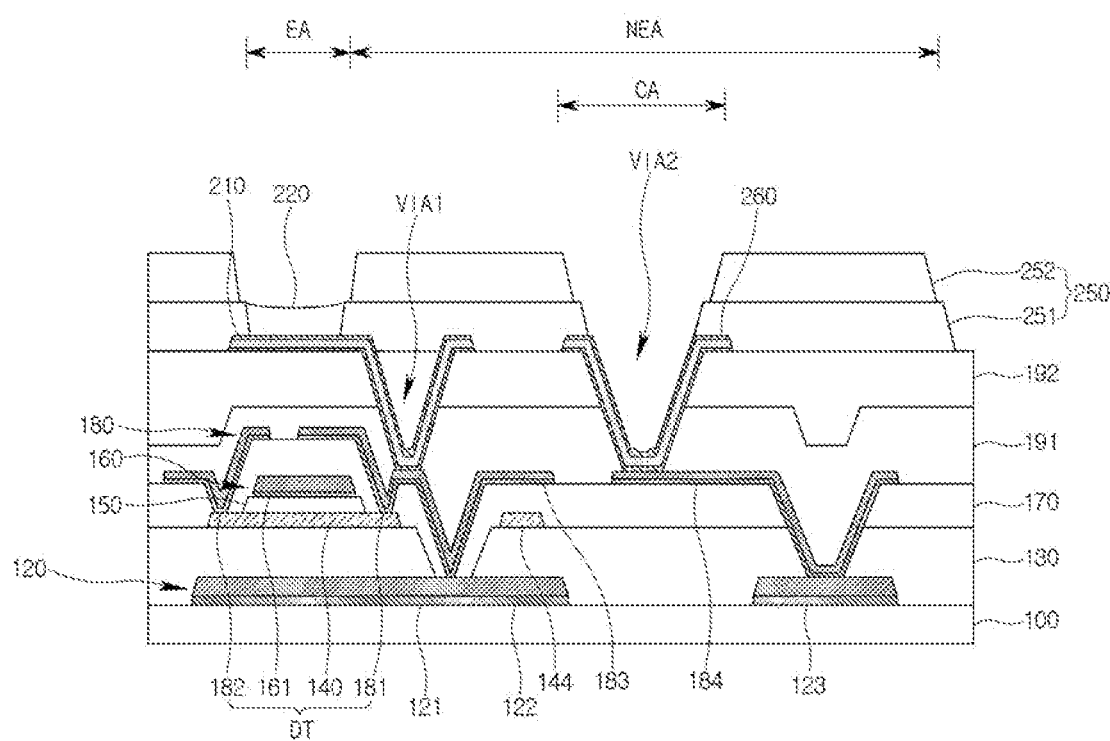

Then, as shown in FIG. 13, the light emitting layer 220 is formed. The light emitting layer 220 is formed on the anode electrode 210 in the light emitting area EA defined by the bank 250.

In the embodiment, the light emitting layer 220 can be formed through a solution process. For example, a solution for forming the light emitting layer 220 within the light emitting area EA can be applied. The solution can be manufactured by mixing organic materials constituting the light emitting layer 220 with a solvent. The solution can be jetted to the light emitting area through an inkjet apparatus having a nozzle mounted on an inkjet head. The applied ink is dried to form the light emitting layer 220. In the light emitting layer 220 to be formed through the solution process, the surface of the central region can be lower than the surface of the edge region. However, the embodiment is not limited thereto.

Figure 14:
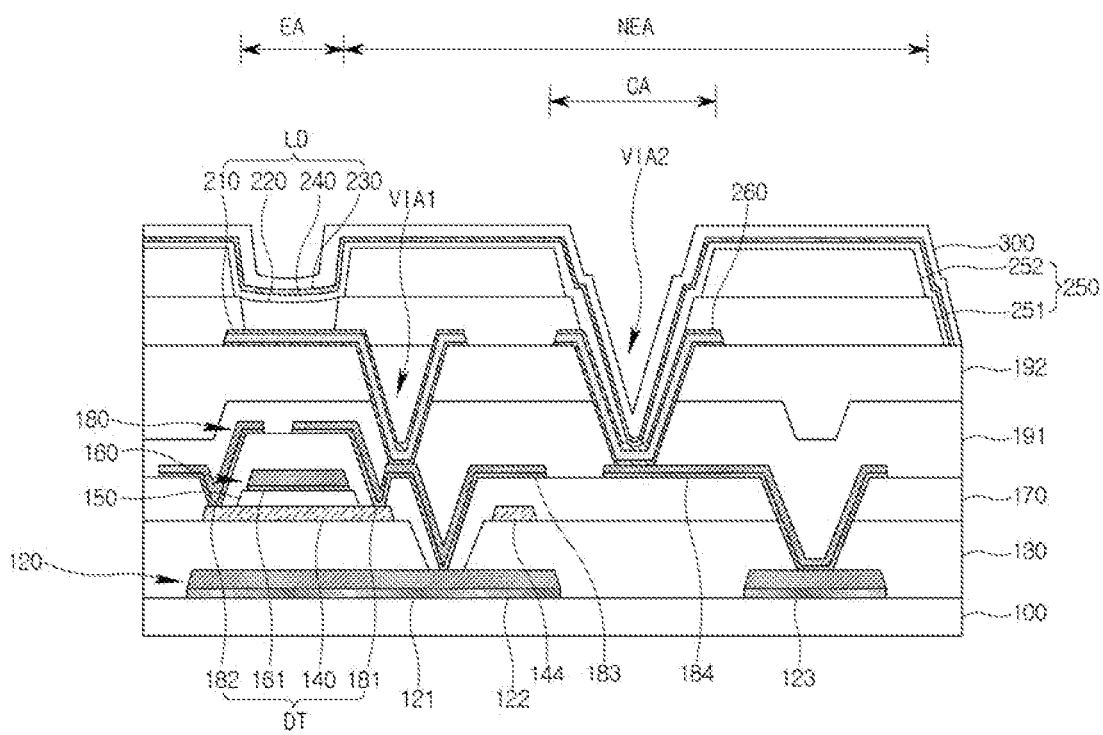
Figure 15:
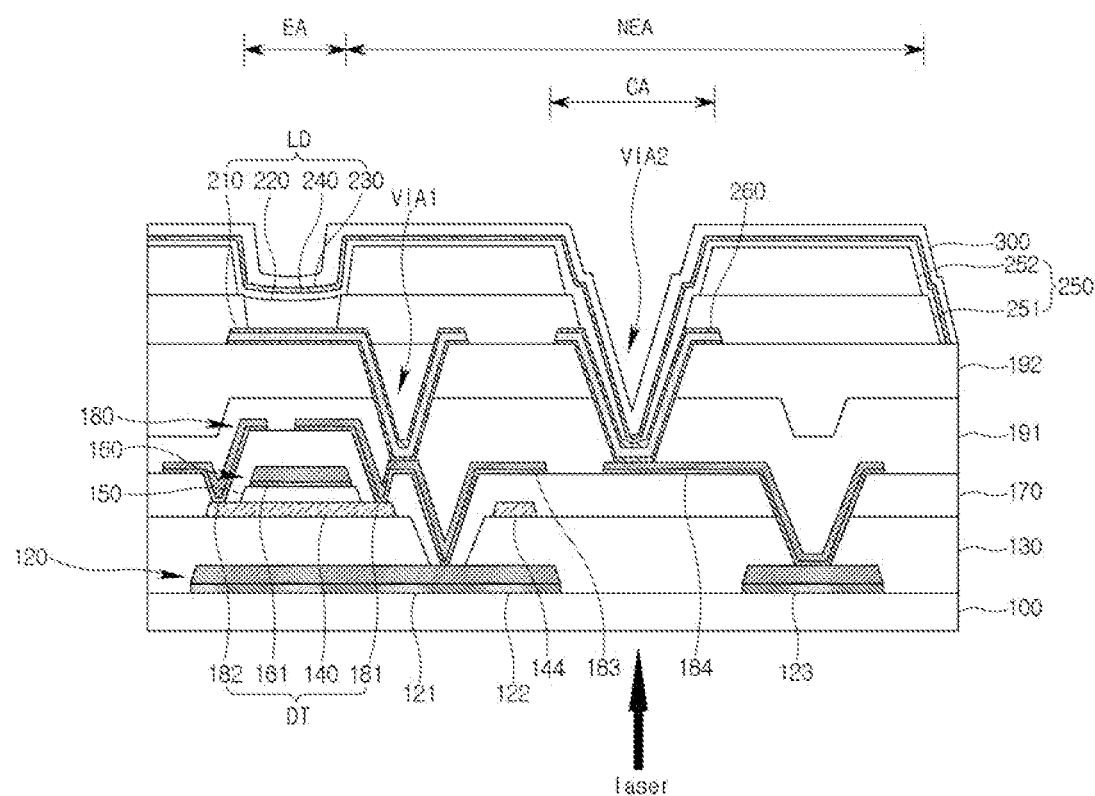

Thereafter, an organic layer is, as shown in FIG. 14, formed. The organic layer can be the electron transport layer 240. The cathode electrode 230 is formed on the electron transport layer 240. The electron transport layer 240 and the cathode electrode 230 can be widely formed on the display panel 50 to cover the bank 250 and the auxiliary electrode 260. The electron transport layer 240 and the cathode electrode 230 can be formed by an evaporation deposition method such as thermal deposition or by a physical vapor deposition method such as a sputtering method Then, the reflow process for the electron transport layer 240 can be performed (e.g., the electron transport layer 240 can be melted away at a specific spot to improve contact between the cathode electrode 230 and the auxiliary electrode 260, in the CA region). For example, as shown in FIG. 14, a laser can be irradiated from below (or from above) the display panel 50. Then, energy by the laser can be transferred to the electron transport layer 240 through the auxiliary electrode 260. The laser irradiated to the electron transport layer 240 can have the intensity distribution shown in FIG. 6. Here, more or less energy by the laser can be transferred to a specific region of the electron transport layer 240 in accordance with the thickness and shape of the patterned auxiliary electrode 260.

At least a portion of the electron transport layer 240 is melted by the energy of the laser transmitted through the auxiliary electrode 260. Then, as described with reference to FIGS. 7 to 11, the electron transport layer 240 flows, so that at least one region of the auxiliary electrode 260 can be exposed toward the cathode electrode 230.

Figure 16:
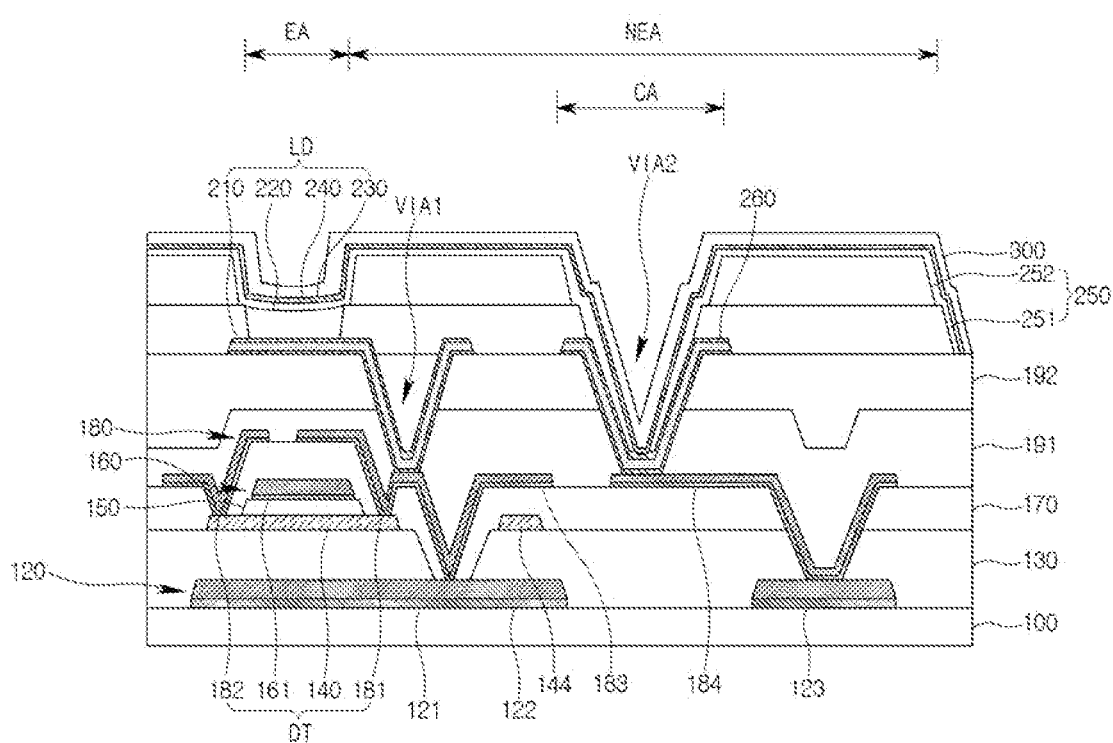

After the reflow process, as shown in FIG. 16, the auxiliary electrode 260 can be in direct contact with the cathode electrode 230 in the exposed region where the electron transport layer 240 is not formed.

As described above, the electron transport layer 240 can be controlled to be selectively removed in an area on the auxiliary electrode 260 by the patterning of the auxiliary electrode 260. Then, the auxiliary electrode 260 and the cathode electrode 230 are partially in direct contact with each other, so that an electrical connection between the cathode electrode 230 and the auxiliary electrode 260 can be stably formed. The cathode electrode 230 can be stably connected to the second power line PL2 via the auxiliary electrode 260.

The display device and the manufacturing method thereof according to the embodiments of the present disclosure can improve a bonding force between the cathode electrode and the auxiliary electrode in consideration of the intensity distribution of laser during a reflow process.

The display device and the manufacturing method thereof according to the embodiments of the present disclosure can optimize, through the patterned auxiliary electrode, the degree of melting of an organic layer (e.g., an electron transport layer) during the reflow process as required.

The display device and the manufacturing method thereof according to the embodiments of the present disclosure can simplify the reflow process and reduce equipment cost by compensating for the limitations of laser equipment by changing the shape of the auxiliary electrode.

It can be understood by those skilled in the art that the embodiments can be embodied in other specific forms without departing from its spirit or essential characteristics. Therefore, the foregoing embodiments and advantages are merely exemplary and are not to be construed as limiting the present invention. It can be understood by those skilled in the art that the embodiments can be embodied in other specific forms without departing from its spirit or essential characteristics.

Therefore, the foregoing embodiments and advantages are merely exemplary and are not to be construed as limiting the present invention. The scopes of the embodiments are described by the scopes of the following claims rather than by the foregoing description. All modification, alternatives, and variations derived from the scope and the meaning of the scope of the claims and equivalents of the claims should be construed as being included in the scopes of the embodiments.

What is claimed is:

1. A display device comprising:
   an auxiliary electrode disposed on a substrate and connected to a first driving power;
   an organic layer disposed on the auxiliary electrode; and
   a cathode electrode disposed on the organic layer,
   wherein the auxiliary electrode includes a concave portion or a convex portion,
   wherein the organic layer is formed on a region of the concave portion or the convex portion,
   wherein the auxiliary electrode comprises the concave portion formed on a top surface of the auxiliary electrode, and
   wherein a portion of the organic layer is formed on a central region of the concave portion.

2. The display device of claim 1, wherein the cathode electrode is in direct contact with the auxiliary electrode in an edge region of the concave portion, and the organic layer is absent from the edge region.

3. The display device of claim 1, wherein the organic layer is further formed on an edge region of the concave portion, and the organic layer is absent from the top surface of the auxiliary electrode.

4. The display device of claim 1, wherein the auxiliary electrode comprises the concave portion formed on a bottom surface of the auxiliary electrode, and
wherein the organic layer is formed in a central region of the concave portion of the auxiliary electrode.

5. The display device of claim 1, wherein the auxiliary electrode comprises a first convex portion formed on a top surface of the auxiliary electrode, and
wherein the organic layer is formed on an edge region of the first convex portion of the auxiliary electrode.

6. The display device of claim 5, wherein the edge region comprises at least one of a region where the first convex portion is not formed and an edge region of the first convex portion.

7. The display device of claim 5, wherein the auxiliary electrode further comprises a second convex portion formed on a bottom surface of the auxiliary electrode, and the second convex portion overlaps with the first convex portion.

8. The display device of claim 1, wherein the auxiliary electrode comprises the convex portion formed on a bottom surface of the auxiliary electrode, and
wherein the organic layer is formed in a central region of the convex portion of the auxiliary electrode.

9. The display device of claim 1, wherein the organic layer is an electron transport layer, and
wherein the first driving power is a low potential driving power.

10. A display device comprising:
an auxiliary electrode disposed on a substrate and connected to a first driving power;
an organic layer disposed on the auxiliary electrode; and
a cathode electrode disposed on the organic layer,
wherein the auxiliary electrode includes a concave portion or a convex portion,
wherein the organic layer is formed on a region of the concave portion or the convex portion, and
wherein a height of the top surface of the auxiliary electrode in a central region of the concave portion or the convex portion is less than a height of the top surface of the auxiliary electrode in an edge region of the concave portion or the convex portion.

11. A display device comprising:
an overcoat layer disposed on a substrate;
a light emitting device disposed on the overcoat layer, the light emitting device having an anode layer, an organic light emitting layer and a cathode layer;
a contact hole extending through the overcoat layer; and
an auxiliary electrode disposed in the contact hole and being connected to a driving power,
wherein the cathode layer includes an organic layer and a cathode electrode layer,
wherein the cathode layer extends across the auxiliary electrode,
wherein the auxiliary electrode includes a contact region in the contact hole, the contact region of the auxiliary electrode having a concave portion or a convex portion, and at least a portion of the cathode electrode layer directly contacts the contact region of auxiliary electrode, and
wherein an upper portion of the anode layer and an upper portion of the auxiliary electrode are made from a same material.

* * * * *